United States Patent
Deimling

(10) Patent No.: US 7,103,490 B2
(45) Date of Patent: Sep. 5, 2006

(54) METHOD FOR PROCESSING RAW MAGNETIC RESONANCE DATA, MAGNETIC RESONANCE TOMOGRAPHY UNIT AND MAGNETIC RESONANCE SPECTROSCOPY UNIT

(75) Inventor: Michael Deimling, Moehrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 97 days.

(21) Appl. No.: 10/681,268

(22) Filed: Oct. 9, 2003

(65) Prior Publication Data

US 2004/0128092 A1 Jul. 1, 2004

(30) Foreign Application Priority Data

Oct. 9, 2002 (DE) .............................. 102 47 150

(51) Int. Cl.
*G06F 19/00* (2006.01)
(52) U.S. Cl. ................... 702/77; 600/410; 600/407; 128/920; 324/307; 324/309
(58) Field of Classification Search .............. 702/77; 600/407, 410, 411, 420, 427, 431, 473, 475; 128/920; 324/307, 309, 322, 310, 303
See application file for complete search history.

(56) References Cited

U.S. PATENT DOCUMENTS

| | | | | |
|---|---|---|---|---|
| 4,463,375 | A | 7/1984 | Macovski | 378/98.12 |
| 5,602,934 | A | 2/1997 | Li et al. | |
| 6,016,057 | A * | 1/2000 | Ma | 324/309 |
| 6,178,271 | B1 * | 1/2001 | Maas, III | 382/294 |
| 6,259,250 | B1 * | 7/2001 | Mock | 324/309 |
| 6,463,167 | B1 * | 10/2002 | Feldman et al. | 382/128 |
| 6,518,796 | B1 * | 2/2003 | Stan et al. | 326/121 |
| 6,603,992 | B1 * | 8/2003 | Debbins et al. | 600/420 |
| 6,956,371 | B1 * | 10/2005 | Prammer | 324/303 |
| 2002/0177771 | A1 * | 11/2002 | Guttman et al. | 600/410 |

FOREIGN PATENT DOCUMENTS

DE 44 31 349 A1 9/1995

OTHER PUBLICATIONS

Yasser M. Kadah, Proc. SPIE vol. 4683, 2002, Robust analysis of event-related functional magnetic resonance imaging data using independent component analysis.*
Yasser M. Kadah et al., SPIE USE, V.2 5031-36 (p. 1-8), Jan. 17, 2003, Nonparametric suppression of random and physiological noise components in functional magnetic resonance imaging using cross-correlation spectrum subtraction.*
F.J.Harris, Proc. IEEE, vol. 66, No. 1(1978): "On the Use of Windows for Harmonic Analysis with the Discrete Fourier Transform".
E. Schrüfer, "Signalverarbeitung", Hanser-Verlag, München, 2. Aufl. 1992; S. 181-195.
R. Archibald, A. Gelb; "A method to reduce the Gibbs ringing artifact in MRI scans while keeping tissue boundary integrity", IEEE Trans. Med. Imaging 21 (2002), S. 305-219.
F. Kruggel et al. "Comparison of filtering methods for fMRI datasets", Neuroimage 10 (1999), S. 530-543.
German Search Report dated Aug. 19, 2005.

* cited by examiner

*Primary Examiner*—John Barlow
*Assistant Examiner*—Hien Vo
(74) *Attorney, Agent, or Firm*—Harness, Dickey & Pierce, P.L.C.

(57) ABSTRACT

A method is for producing a map from raw magnetic resonance data from a magnetic resonance tomography unit or a spectrum from raw magnetic resonance data from a magnetic resonance spectroscopy unit. The method involves the raw data being filtered, preferably using a high pass filter and using a low pass filter. Next, the two absolute values of the filtered, Fourier transformed raw magnetic resonance data are used to produce the map or the spectrum by a weighted combination. The method is distinguished in that the signal to noise ratio can be improved together with an increase in the edge sharpness.

43 Claims, 7 Drawing Sheets

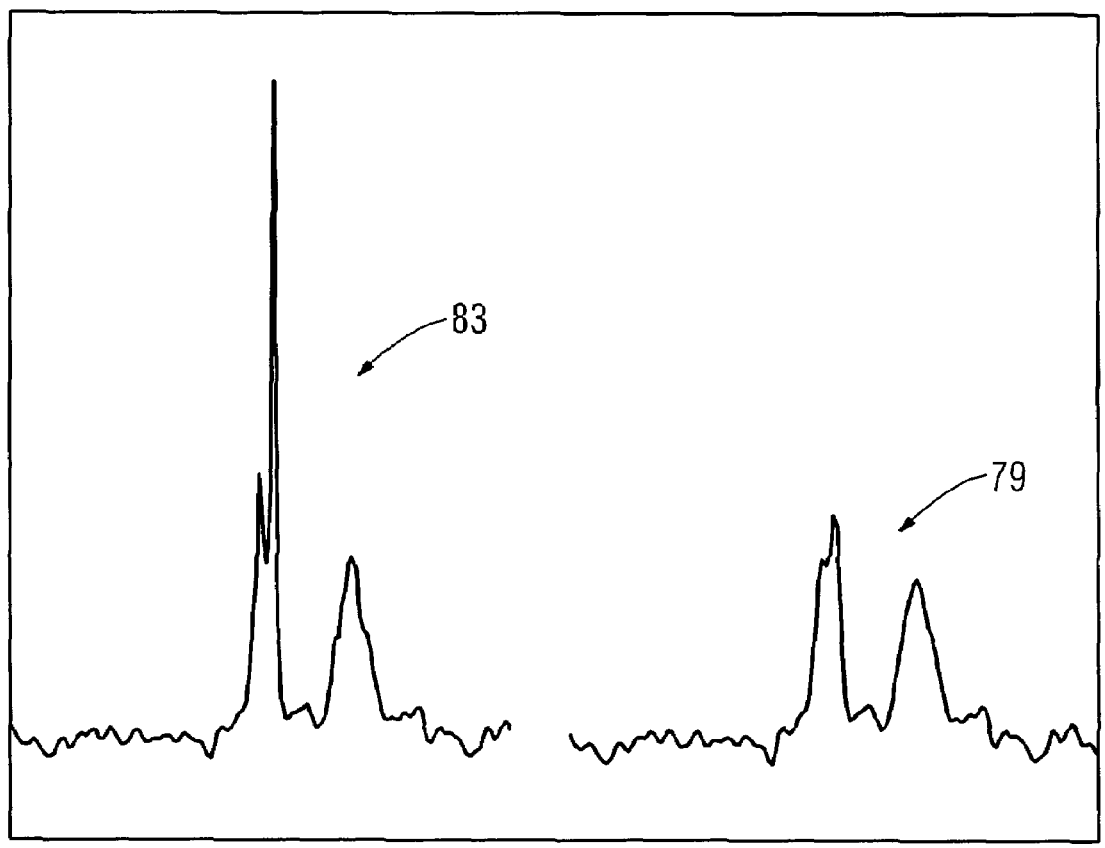

METHOD FOR PROCESSING RAW MAGNETIC RESONANCE DATA, MAGNETIC RESONANCE TOMOGRAPHY UNIT AND MAGNETIC RESONANCE SPECTROSCOPY UNIT

The present application hereby claims priority under 35 U.S.C. §119 on German patent application number DE 10247150.9 filed Oct. 9, 2002, the entire contents of which are hereby incorporated herein by reference.

FIELD OF THE INVENTION

The invention generally relates to a method for postprocessing raw magnetic resonance data. The invention also generally relates to a magnetic resonance tomography unit or a magnetic resonance spectroscopy unit which is respectively matched to such a method for postprocessing raw magnetic resonance data.

BACKGROUND OF THE INVENTION

The aim of processing raw magnetic resonance data, which can originate both from magnetic resonance spectroscopy units and from magnetic resonance tomography units, is to extract the medically relevant information from the raw magnetic resonance data as well as possible. In the case of magnetic resonance tomography, the aim is accordingly a picture with high resolution of detail and low noise. That is to say, the aim is for a picture with high edge sharpness and a high signal to noise ratio (SNR).

In the case of magnetic resonance spectroscopy, the aim is to obtain from the raw data a linear spectrum with high resolution and with a high SNR. The quality in the processing of raw magnetic resonance data is thus firstly in the edge sharpness and image sharpness, i.e. in sharp pictures with high contrast. Secondly, it is in the production of a high SNR, so that the essence of the picture or of the spectrum is highlighted.

In the case of the various approaches to achieving this aim, it is usually not possible to increase the image sharpness and the SNR simultaneously. This drawback has a direct effect on the quality of the magnetic resonance tomography and spectroscopy. To improve the resolution of detail, radio-frequency "blue" noise is superimposed on a picture, for example. This produces a subjective increase in the resolution of detail. A likewise subjective improvement in the resolution is brought about in a similar manner by the application of high pass filters to the image data. This also amplifies the image noise, however.

To improve the SNR in the case of magnetic resonance pictures, known filters (such as the Hanning filter, the Fermi filter or the cosine filter in the frequency domain) are applied to the raw magnetic resonance data. The action of such filters is known from the literature, e.g.: F. J. Harris, Proc. IEEE, Vol. 66, No 1 (1978): "On the Use of Windows for Harmonic Analysis with the Discrete Fourier Transform". It is also possible to apply postprocessing filters in the space domain, for example a mean filter, median filter or ARMA filter.

In addition, U.S. Pat. No. 4,463,375 discloses a method for medical image processing. This method specifies a reduced-noise version of a first processed image which has been obtained from a multiplicity of measurements in a multipicture system, e.g. using a computer tomography unit. The method first involves producing a second image with a high SNR from the multiplicity of measurements. The first image is then processed using a filter which reduces the noise. The second image is processed using a filter which is complementary to this filter. The weighted combination of the two images produces the reduced-noise version of the first processed image.

SUMMARY OF THE INVENTION

An embodiment of the invention includes an object of specifying a method for processing raw magnetic resonance data and a magnetic resonance tomography unit and a magnetic resonance spectroscopy unit which produce pictures or spectra with high edge sharpness without impairing the image noise, i.e. the SNR, in the process.

For the method, an embodiment of the invention achieves an object by virtue of a method having the method features below being carried out in order to postprocess raw magnetic resonance data. In a first step, the raw magnetic resonance data are filtered using a first filter. These filtered data are Fourier transformed in a second step. The absolute value for the Fourier transformed data is then formed in a third step and in this way a first magnetic resonance signal is obtained. In a fourth step, the unfiltered, original raw magnetic resonance data are Fourier transformed. This is followed in the fifth step by second absolute value formation for the unfiltered Fourier transformed data. Finally, weighted combination of the two magnetic resonance signals is performed and in this way the postprocessed magnetic resonance signal is obtained.

The method includes the weighted combination of two magnetic resonance signals, the magnetic resonance signals having been obtained from the same raw magnetic resonance data once with and once without filtering. Through suitable choice of the filter and of the parameters for the weighted combination, a picture which is optimized in terms of the representation wanted from a medical point of view is extracted.

One advantage of the method is that the SNR is significantly improved following the weighted combination of the two magnetic resonance signals and that an edge-emphasized magnetic resonance signal is produced at the same time. In comparison with the method from U.S. Pat. No. 4,463,375, the involvement for this method is significantly reduced. This occurs since it is firstly based only on the raw data from a single measurement, and since it is secondly independent of an image with a high SNR which is produced from a plurality of measurements.

In one particularly simple extension of the method, the raw magnetic resonance data are filtered using a second filter before the second magnetic resonance signal is produced. This allows the second magnetic resonance signal to be influenced and thus allows it to improve the weighted combination. The use of the unfiltered raw magnetic resonance data in the original method corresponds to the application of the identity filter and is faster to execute.

A weighted combination within the context of an embodiment of the invention is in this case a mathematical combination of the absolute values of the two magnetic resonance signals. These have the same local coding and represent the echo signal from a magnetic resonance measurement, for example in a one-dimensional or multidimensional pixel structure, following the Fourier transformation. In this case, the combination, which is usually addition, is spatially consistent, i.e. the same spatial areas are combined.

By way of example, combination takes place pixel by pixel. The weighting is effected using a weighting factor. For a spatial area of one of the two magnetic resonance signals, this weighting factor depends on the information content, e.g. the intensity, of the same spatial area in the other magnetic resonance signal. By way of example, the weighting factor can have a linear dependency on the information content or can have any other beneficial nonlinear dependency on the information content of the spatial area. The weighting factor can be produced, by way of example, by a mathematical step function which sets the weighting factor to a small value or zero below a previously stipulated threshold value for the absolute value of the magnetic resonance signal in question.

One advantage of weighted combination is that the SNR is significantly improved following the weighted combination of the two filters. Further, this data weighting produces an edge-emphasized profile in the magnetic resonance signal.

The method relates to the postprocessing of raw magnetic resonance data from a single measurement and is not dependent on whether the raw data belong to a single picture or whether they belong to a picture from a series of pictures which show a development over time, for example. The raw magnetic resonance data can be raw data from a measurement in a magnetic resonance spectroscopy unit or else raw data from a picture in a magnetic resonance tomography unit.

Accordingly, an embodiment of the invention achieves an object for a magnetic resonance tomography unit by use of a magnetic resonance tomography unit which is matched to a method for postprocessing raw magnetic resonance data with the method features above. In this case, the raw magnetic resonance data are referred to as a spin echo signal or an echo signal, for example. The magnetic resonance signals correspond to the one-dimensional or multidimensional magnetic resonance pictures, for example.

An embodiment of the invention achieves an object for a magnetic resonance spectroscopy unit by use of a magnetic resonance spectroscopy unit which is matched to a method for postprocessing raw magnetic resonance data with the method features above. In this case, spectroscopic data, e.g. the FID (Free Induction Decay) signal, are postprocessed.

In one particularly beneficial embodiment of the method, the filters are applied to the raw magnetic resonance data after demodulation thereof. This allows the filters to be applied in their customary form of representation in the frequency domain. Applying the filters after demodulation has the advantage that the filters can be very narrowband.

In one particularly advantageous embodiment, the first filter is a low pass filter which filters rapid changes out of the raw data and thus suppresses radio-frequency oscillations. By way of example, the low pass filter can be a type of Hanning filter.

In another embodiment the second filter is a high pass filter which passes only the rapid changes in the signal, which are also caused by noise, for example. Magnetic resonance signals which have been high pass filtered show an excessive increase in rapidly rising edges.

In one particularly advantageous embodiment which uses self-weighting for the combination, the weighted combination is effected as follows:

$$C = A + \lambda \left( \frac{B}{A_{max}} \right)^{\kappa} B \qquad \text{[Equation 1]}$$

In this case, A and B are magnetic resonance signals which are subjected to weighted combination by low pass filtering (A) and high pass filtering (B), for example. $A_{max}$ is the maximum of the magnetic resonance signal A. The two parameters $\lambda$ and $\kappa$ determine the contribution level of the magnetic resonance signal B to the postprocessed magnetic resonance signal C. The quotient of B and $A_{max}$ brings about amplified correction of the pixels which have a high absolute value in the magnetic resonance signal B. The values of $\lambda$ and $\kappa$ need to be ascertained empirically on the basis of their influence and their optimum effect on the magnetic resonance signal. In this case, the values of $\lambda$ and $\kappa$ are preferably between 1 and 3.

One advantage of the quotient which normalizes B to $A_{max}$ is that an uncontrolled signal contribution for B is avoided in regions in which there is actually nothing to correct or to improve.

The weighted combination of suitably filtered magnetic resonance signals has the advantage that, in a single magnetic resonance measurement, the noise in the resultant magnetic resonance signal is lower than with linear addition or subtraction of the two filtered magnetic resonance signals.

In particular embodiments, the method from the invention can be applied to raw magnetic resonance data which cover a one-dimensional or multidimensional space which is to be examined. Depending on the application, one-dimensional sections, two-dimensional sectional views or three-dimensional volume representations are shown, for example, in magnetic resonance technology. The raw magnetic resonance data contain the dimension of the respective picture.

In one advantageous embodiment, the dimensionality of the Fourier transformation performed during the method is chosen such that the dimension of the raw magnetic resonance data is retained. Thus, the method can be applied, by way of example, to two-dimensional magnetic resonance sectional views or to three-dimensional volume representations. Even in the case of magnetic resonance spectra, one-dimensional or multidimensional representation, for example in three dimensions, is possible.

In one particularly advantageous embodiment of the method, two locally coded magnetic resonance signals are combined such that the contribution of one magnetic resonance signal to the weighted combination is formed by multiplying this magnetic resonance signal by a weighting factor. The weighting factor depends on the other magnetic resonance signal such that it is greater for a large magnetic resonance signal than for a small magnetic resonance signal.

In one specific embodiment, the weighting factor has a nonlinear dependency on the absolute value of a magnetic resonance signal. At least in one dimension of the raw magnetic resonance data, the same nonlinear dependency is used in order to have the same effect on the image sharpness, for example, over all the pixels in this dimension.

In one particular embodiment of the method, the raw magnetic resonance data are processed using a plurality of filters before the differently filtered magnetic resonance signals are subsequently combined by means of weighted combination to form a single postprocessed magnetic resonance signal.

BRIEF DESCRIPTION OF THE DRAWINGS

A plurality of exemplary embodiments of the method, of the magnetic resonance tomography unit and of the magnetic resonance spectroscopy unit based on the invention will become more fully understood from the detailed description of preferred embodiments given hereinbelow and the accompanying drawings, which are given by way of illustration only and thus are not limitative of the present invention, and wherein:

FIG. 9 shows a comparison of the magnetic resonance spectrum obtained by weighted combination with the low pass filtered magnetic resonance spectrum, both magnetic resonance spectra having been normalized to the same noise.

DETAILED DESCRIPTION OF THE PREFERRED EMBODIMENTS

Figure 1:
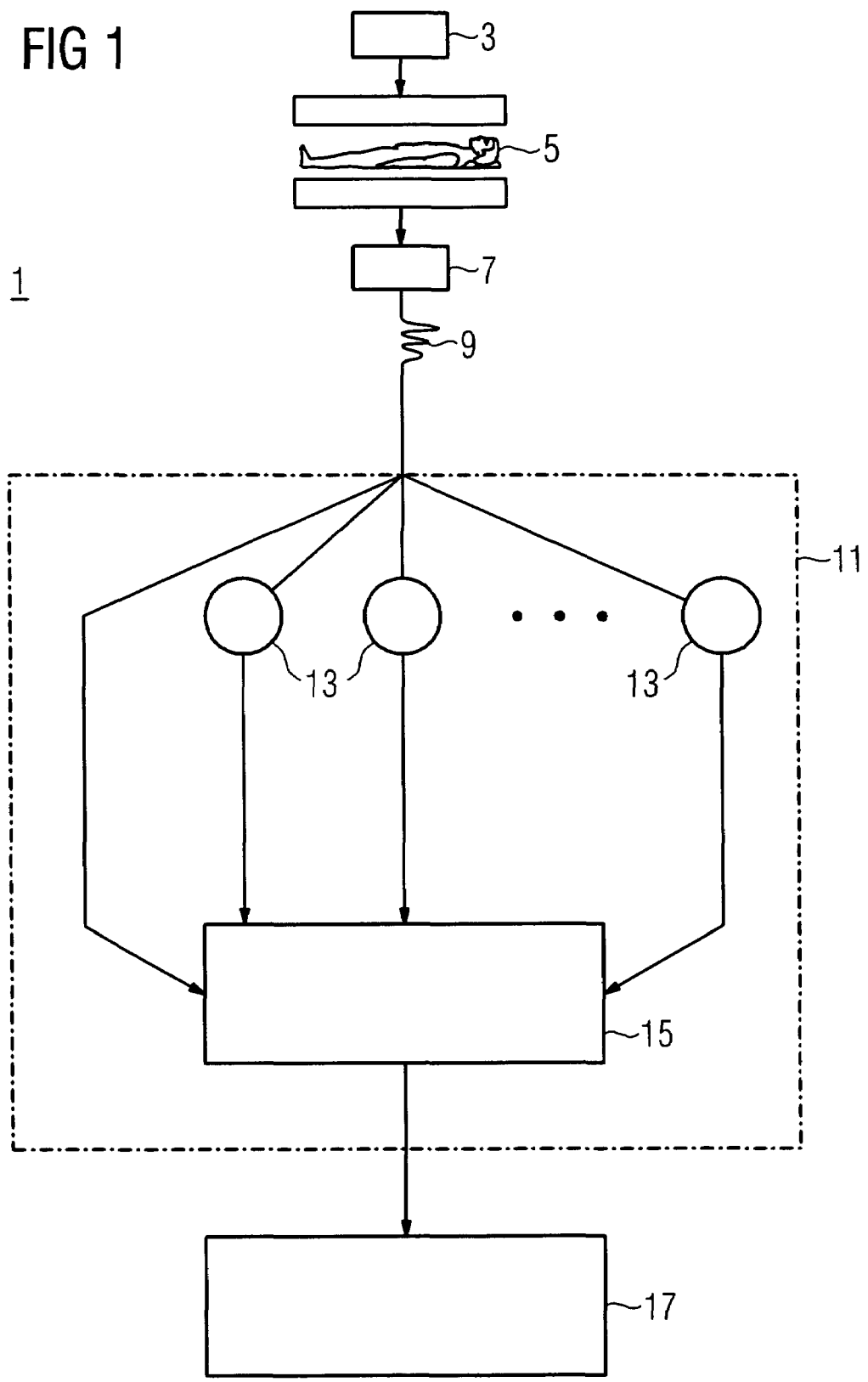
FIG. 1 shows a flowchart of an exemplary embodiment of the method which has been implemented in a magnetic resonance tomography unit.

FIG. 1 schematically shows the flow of the method and the necessary components which are required within a magnetic resonance tomography unit 1 for the flow of the method. In a magnetic resonance tomography unit 1 having a conventional magnet and gradient system (not shown explicitly) used for local coding, a radio-frequency transmitter 3 is used to irradiate an examined object 5 with radio-frequency pulses. The electromagnetic signals emitted by the examined object 5 are received using a radio-frequency receiver 7. The output signals from the radio-frequency receiver 7 form the raw magnetic resonance data in the form of a spin echo signal 9.

These data are postprocessed within a data processing installation 11. The latter subjects them to weighted combination with one another either in unfiltered form or in a form filtered using various filters 13 in a weighting unit 15. The result is a postprocessed magnetic resonance signal 17 in the form of a magnetic resonance picture.

Figure 2:
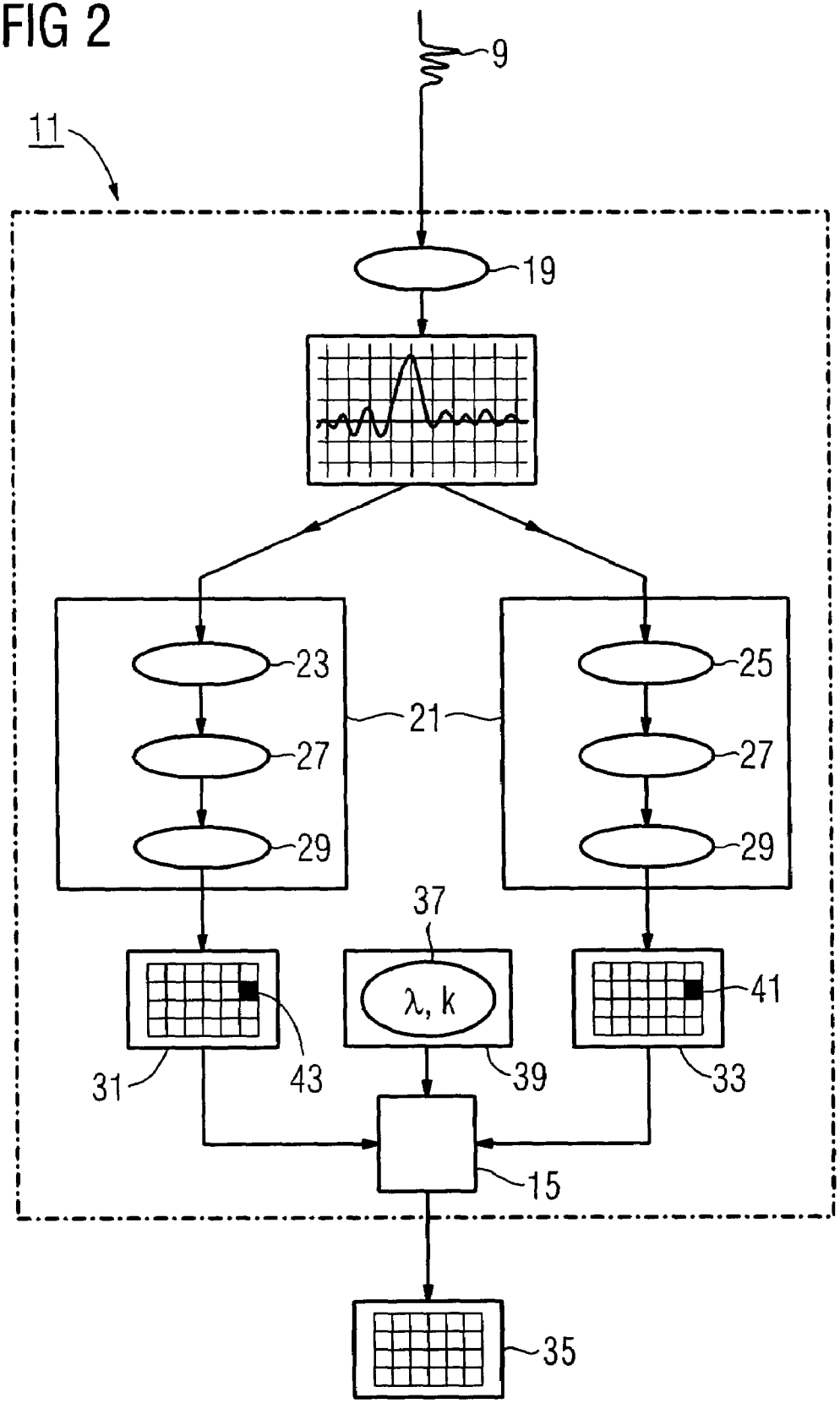
FIG. 2 shows a flowchart of an exemplary embodiment of the method in which two filtered magnetic resonance signals are subjected to weighted combination.

FIG. 2 shows a flow chart of an exemplary embodiment of the method in which two filtered magnetic resonance signals are subjected to weighted combination in the data processing installation 11. In this case, the spin echo signal 9 is first demodulated in a demodulation unit 19, so that it is available in the k domain with the dimension of the sampling. Next, the spin echo signal 9 is supplied to two data processing units 21 having a respective filter. There, the spin echo signal is filtered once using the low pass filter processor 23 and the other time using the high pass filter processor 25.

Following the subsequent Fourier transformations 27 and the absolute value formations 29, one firstly obtains the low pass filtered magnetic resonance picture 31 and the high pass filtered magnetic resonance picture 33, respectively. These two magnetic resonance pictures are combined in the weighting unit 15 by weighted addition to form a single postprocessed magnetic resonance picture 35. The weighted addition is carried out by inputting parameters 37 using an input unit 39. The parameters 37 determine the weighting of the pixel 41 in the high pass filtered magnetic resonance picture 33 on the basis of the same pixel 43 in the low pass filtered magnetic resonance picture 31. With a suitable choice of weighted addition and its parameters, the postprocessed magnetic resonance picture 35 has both a high SNR and great edge sharpness.

When the method is used with a magnetic resonance spectroscopy unit, the flowchart is comparable with that in FIGS. 1 and 2. The only difference is that raw data from magnetic resonance spectra are filtered and subjected to weighted addition by means of the method in order to achieve a higher resolution and a greater SNR.

Figure 3:
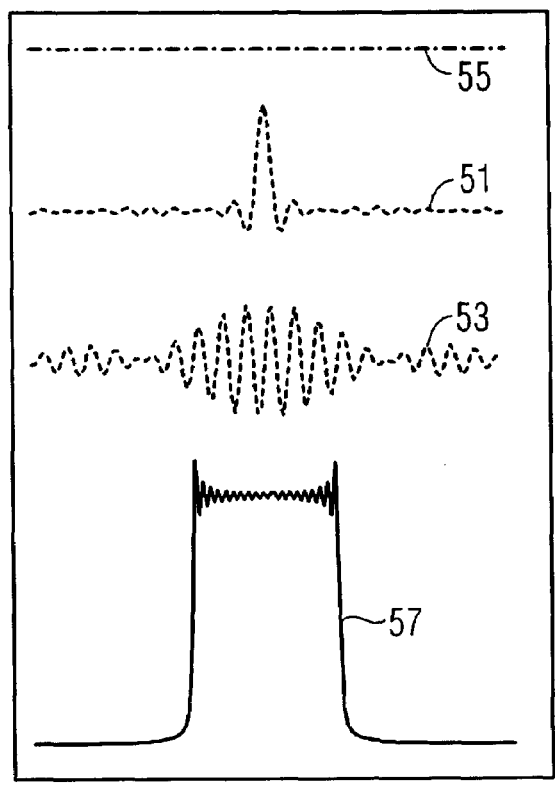
FIG. 3 shows a numerical simulation of the processing of raw magnetic resonance data using a spin echo signal which is brought about by a square object in the image gradient of a magnetic resonance tomography unit.
Figure 4:
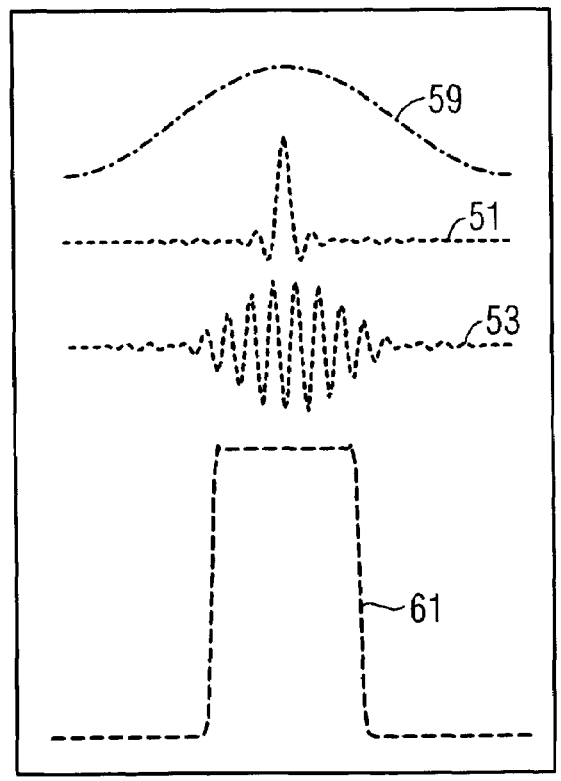
FIG. 4 shows a numerical simulation of the processing when a low pass filter is applied to the spin echo signal from FIG. 3.
Figure 5:
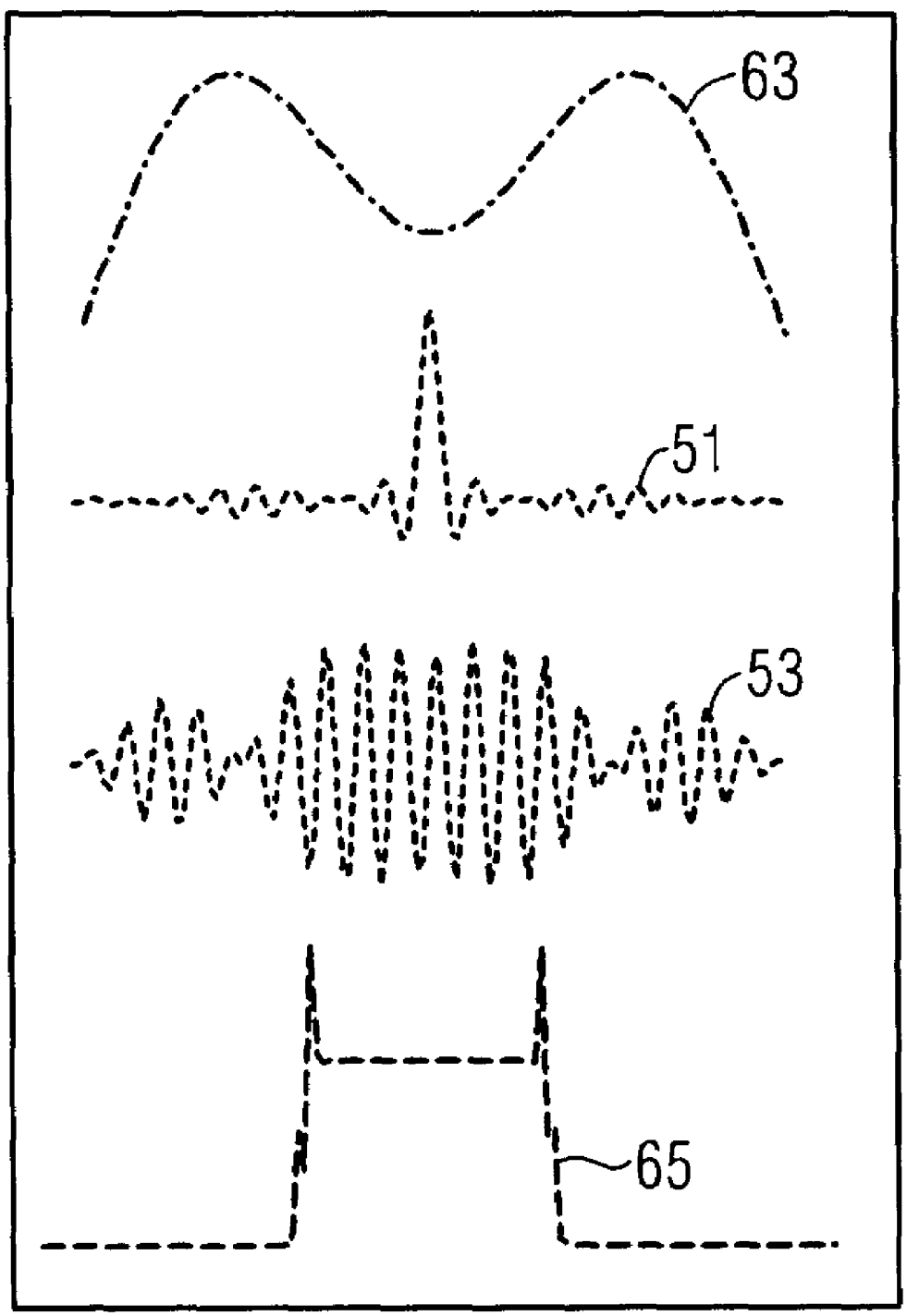
FIG. 5 shows a numerical simulation of the processing when a high pass filter is applied to the spin echo signal from FIG. 3.

FIGS. 3 to 5 show the results of a numerical simulation of a spin echo signal for a square object in the field gradient of the magnetic resonance tomography unit 1. The simulation relates to a section through a square object and illustrates the effect of the method on the object's edge sharpness. The object is in the area of the 128 pixels in the simulation.

The figures respectively show the real and imaginary parts 51 and 53 of the echo signal after a filter has been applied to the echo signal. They show the filter function and the complex-value spin echo signal above a $k_x$ axis in the k domain. Various filter functions clarify the action of the filters on the echo signal in the K domain. In addition, FIGS. 3 to 7 show the result of Fourier transforming the filtered complex-value echo signal with subsequent absolute value formation. In this way, a simulated measurement result is obtained from a magnetic resonance tomography unit, in this case a one-dimensional section through the square object. The sectional view of the measurement result is plotted above the corresponding spatial axis.

FIG. 3 shows the real part 51 and the imaginary part 53 of the unfiltered echo signal and also the result of the Fourier transformation and of the absolute value formation for the unfiltered echo signal, in this case referred to as identity simulation result 57. In the simulation, no filter 55 was applied to the echo signal in this case. The oscillations in the identity simulation result 57 in the area of the rising and falling edges can be seen clearly. These oscillations limit the edge sharpness in the simulated (unpostprocessed) measurement.

FIG. 4 shows the influence of the low pass raw data filter 59 on the spin echo signal. The low pass raw data filter 59 has been applied in the form of a Hanning filter $F_H$ to the spin echo signal, the Hanning filter $F_H$ having the following form in the one-dimensional k domain:

$$F_{T,H} = F_H = \tfrac{1}{2} \times [1 + \cos(2\pi(j-N/2)/N)] \qquad \text{[Equation 2]}$$

In this case, N is the number of sampling points in the picture in one dimension. The filter modulation follows a cosine function whose maximum is shifted by N/2, that is to say to the center of the k domain. The index j describes the jth sampling point. The filter suppresses the marginal area of the k domain with lower intensity in the echo signal. This can clearly be seen from the reduced oscillation amplitude of the filtered spin echo signal in the marginal area. The low pass simulation result 61 in FIG. 4 shows a rounded edge for the square object. This can also be seen in FIGS. 5 and 6.

In FIG. 5, the simulation is carried out for a high pass raw data filter 63, with the high pass filter in the k domain being a modulated Hamming filter $F_H$ provided with an offset:

$$F_{H,H} = (F_H + \text{Offset}) \times \cos^n(\pi(j-N/2)/N) \quad \text{[Equation 3]}$$

In this case, the modulation of the Hanning filter $F_H$ takes place with a cosine function to the power of n, with the minima of the cosine function being at the two ends and in the center of the k domain. The additional minima at the ends have the advantage that they cause no additional artefacts in the Fourier transformation. Thus, by way of example, the "truncation artefact" in the Fourier transformation is suppressed.

In this case, the offset parameter of the modulated Hanning filter has the value 0.2 and the power n of the cosine modulation has the value 1. The high pass raw data filter 63 amplifies the wings of the echo signal in the k domain. In the real part 51 and in the imaginary part 53 of the filtered echo signal, it is possible to see the amplified amplitude of the echo signal oscillations in the marginal areas and a suppression in the central area. The high pass simulation result 65 shows a marked overshoot in the area of the edges of the square object.

Figure 6:
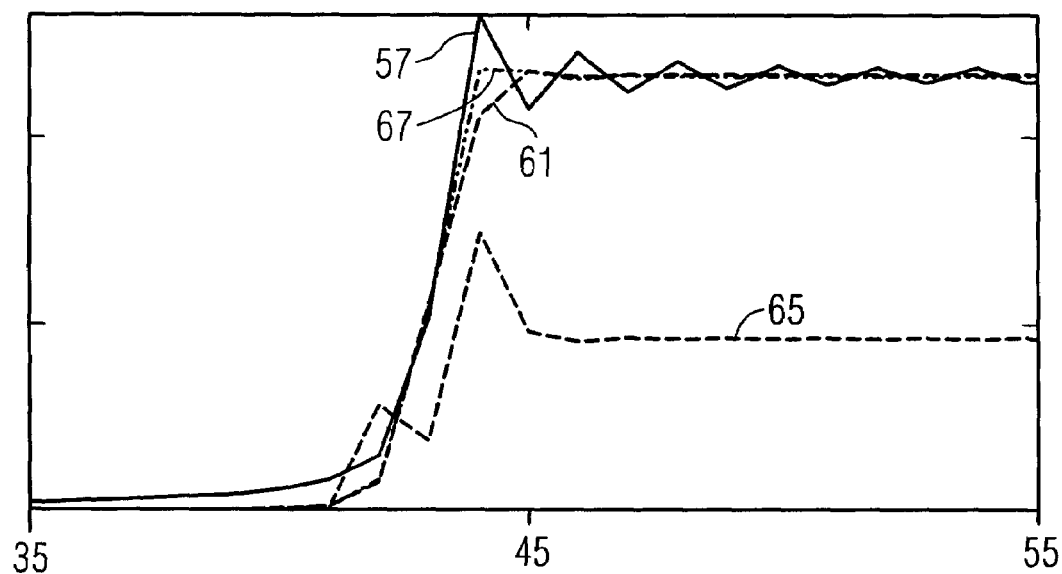
FIG. 6 shows an abscissa detail from FIGS. 3 to 5 to illustrate the action of the method using the edge-emphasized profile which is achieved by the weighted combination.

FIG. 6 shows a detail from the simulation results in the area of the pixels 35 to 55, i.e. in the area of the rising edge. The oscillations in the identity simulation result 57 can clearly be seen. The edge of the square object is rounded in the case of the low pass simulation result 61.

The high pass simulation result 65 shows a pronounced signal overshoot right in the area of the rise. Using the weighted addition of the two filtered simulation results, it is now possible to achieve an edge-emphasized postprocessing result 67. To this end, a weighted combination has been performed in line with the equation 1 already indicated above. In this case, the low pass simulation result 61 corresponds to the magnetic resonance signal A and the high pass simulation result 65 corresponds to the magnetic resonance signal B.

The parameters κ and λ are set such that a maximum sharpness is produced in the edge area. In this case, λ and κ are usually between the values 1 and 3. The level obtained for the weighting of the contribution of B depends on the ratio of the absolute value in the respective pixel in B to the maximum value $A_{max}$ of the pixels in A, i.e. the higher the value of the high pass simulation result 65 in a pixel, the higher its contribution. κ then performs a type of linear weighting, while λ weights the influence of this quotient as a power of the ratio of B and A, that is to say indicates how greatly the correction of A is determined by the ratio of magnitudes for B with respect to A. The parameters κ and λ have been set to the values 0.6 and 2.3, respectively, in FIGS. 6 and 7.

Besides the edge sharpness, the SNR of the postprocessing result 67 is also increased, and is now comparable to the SNR of the low pass simulation result 61. This can be seen from the suppression of the signal before the rising edge, i.e. there is a low base contribution outside the object.

Figure 7:
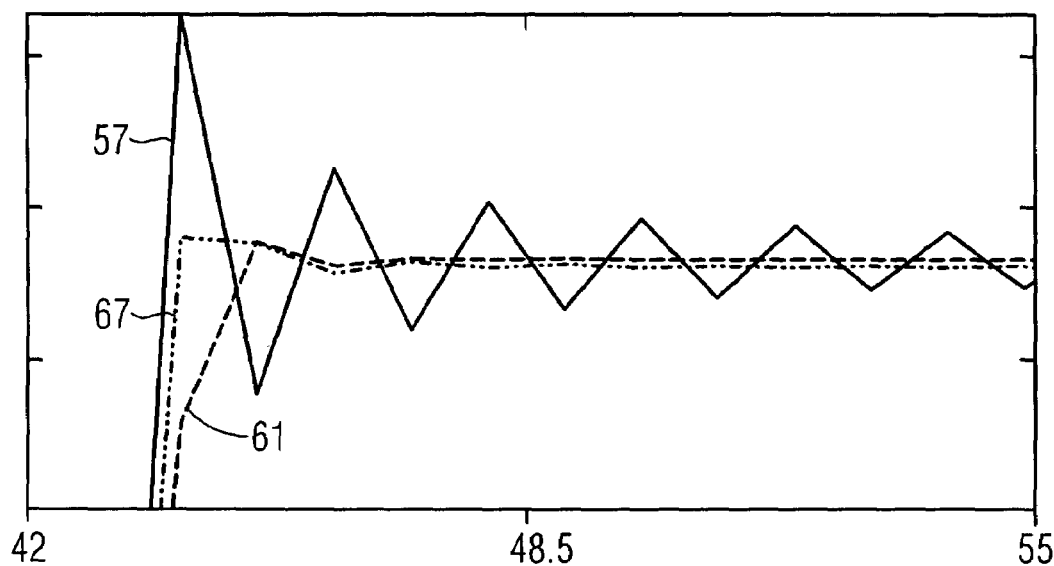
FIG. 7 shows an enlargement of FIG. 6 in the area of an edge of the square object.

FIG. 7 shows a further enlarged detail from the simulated measurement results. The representation focuses on the edge area of the square object in the area of pixels 42 to 55 with signal levels between 10 and 13. It can clearly be seen how the greatly oscillating identity simulation result 57 is freed from the radio-frequency oscillations using the low pass filter. Next, the weighted addition fills the corner area of the square object on account of the high signal absolute values in the high pass simulation result 65. The oscillations in the identity simulation result 57 are also called "ringing". This artefact, which is also called truncation artefact, is suppressed using the method of the invention.

Figure 8:
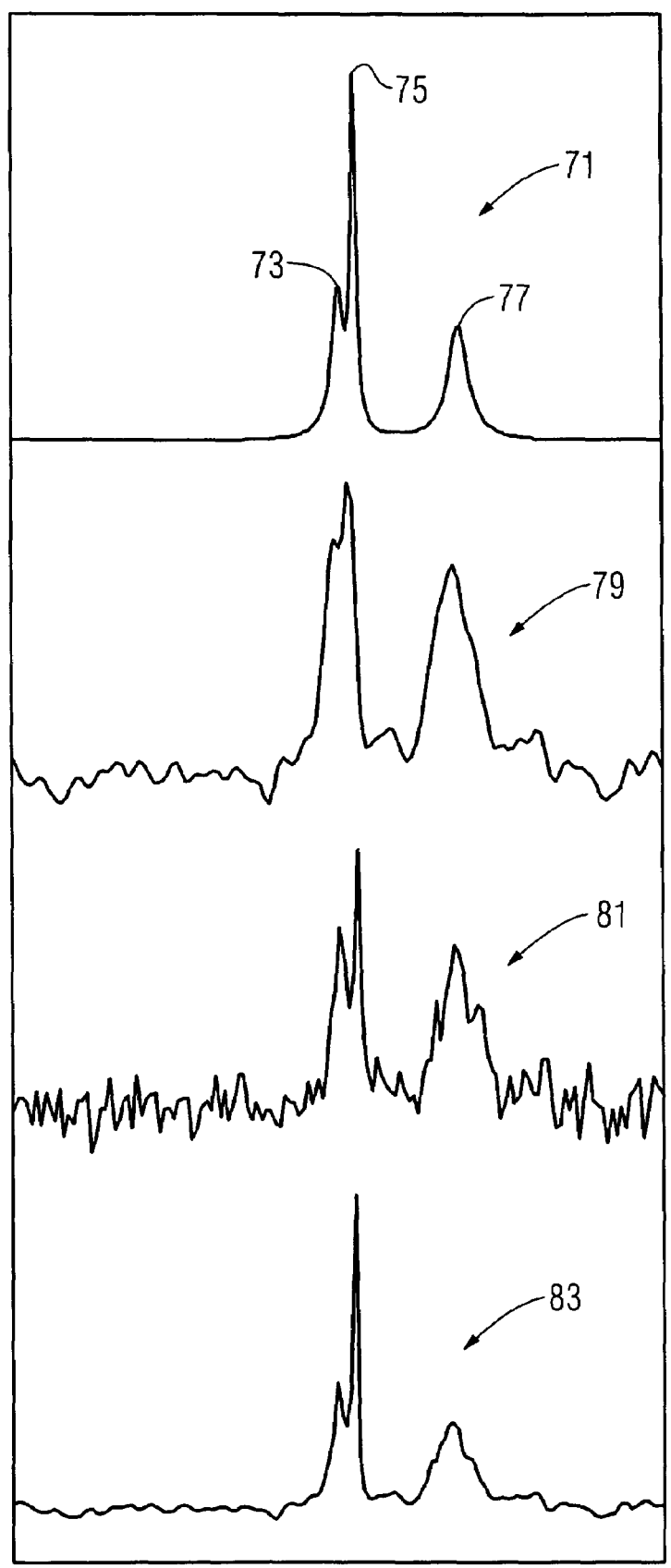
FIG. 8 shows a numerical simulation of the processing of raw magnetic resonance data for the case of magnetic resonance spectroscopy using an FID signal which has been formed by the sum of three Lorentz lines.

FIG. 8 shows the flow of the method applied to raw magnetic resonance data from a simulated magnetic resonance spectroscopy measurement in which an FID signal 71 is measured which is formed by the sum of three Lorentz lines (73, 75, 77). FIG. 8 shows the real parts of the FFT spectra involved in the method. In the simulation, a noise contribution has been added to the synthesized FID signal 71. Low pass filtering of the FID signal 71 results in the low pass filtered spectrum 79, and high pass filtering results in the high pass filtered spectrum 81. Following the weighted combination of the two filtered spectra, the postprocessed magnetic resonance spectrum 83 is obtained. It is possible to see markedly reduced noise and high resolution of the three Lorentz lines on account of the use of the method of the invention.

In FIG. 9, the postprocessed magnetic resonance spectrum 83 is compared with the low pass filtered spectrum 79. To clarify the influence of the method, the two spectra have been normalized to the same noise in this case. The narrower line widths and a considerable increase in the contrast in the postprocessed magnetic resonance spectrum 83 are clearly evident.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for post-processing raw magnetic resonance data, comprising:
   filtering the raw magnetic resonance data;
   Fourier transforming the filtered data;
   forming a first magnetic resonance signal from an absolute value of the Fourier transformed filtered data results;
   Fourier transforming the raw magnetic resonance data;
   forming a second magnetic resonance signal from an absolute value of the Fourier transformed raw magnetic resonance data; and
   forming a post-processed magnetic resonance signal from a weighted combination of the first and second magnetic resonance signals; wherein
   the two magnetic resonance signals are weighted such that the contribution of one of the magnetic resonance signals to the weighted combination is formed by multiplying this magnetic resonance signal by a weighting factor, with the weighting factor depending on the other of the magnetic resonance signals such that it is relatively greater when an absolute value of this magnetic resonance signal is large and relatively less when the absolute value is small.

2. The method as claimed in claim 1, wherein the raw magnetic resonance data are filtered using a second filter, separate from a first filter used in first filtering the raw magnetic resonance data, before the Fourier transformation used in forming the second magnetic resonance signal.

3. The method as claimed in claim 2, wherein the raw magnetic resonance data are filtered after demodulation.

4. The method as claimed in claim 2, wherein the raw magnetic resonance data are obtained using a magnetic resonance spectroscopy unit.

5. The method as claimed in claim 2, wherein the raw magnetic resonance data are obtained using a magnetic resonance tomography unit.

6. The method as claimed in claim 2, wherein at least one of the filters is a low pass filter.

7. The method as claimed in claim 6, wherein the low pass filter is a type of Hanning filter.

8. The method as claimed in claim 2, wherein at least one of the filters is a high pass filter.

9. The method as claimed in claim 8, wherein the high pass filter is a type of inverse Harming filter.

10. The method as claimed in claim 2, wherein the raw magnetic resonance data are data for at least one of a one-dimensional and multidimensional space to be examined.

11. The method as claimed in claim 2, wherein, for the weighted combination, the contribution of one of the magnetic resonance signals has a nonlinear dependency on the absolute value of the other magnetic resonance signal.

12. The method as claimed in claim 11, wherein the same nonlinear dependency is used at least in one dimension of the raw magnetic resonance data.

13. A magnetic resonance tomography unit matched to a method for post-processing raw magnetic resonance data as claimed in claim 2.

14. The method as claimed m claim 2, wherein the first filtering is done using a low pass filter and the second filtering is done using a high pass filter.

15. The method as claimed in claim 14, wherein the low pass filter is a type of Harming filter and wherein the high pass filter is a type of inverse Hanning filter.

16. A magnetic resonance spectroscopy unit matched to a method for post-processing raw magnetic resonance data as claimed in claim 15.

17. A magnetic resonance tomography unit matched to a method for post-processing raw magnetic resonance data as claimed in claim 14.

18. The method as claimed in claim 1, wherein the raw magnetic resonance data are filtered after demodulation.

19. The method as claimed in claim 18, wherein the raw magnetic resonance data are obtained using a magnetic resonance spectroscopy unit.

20. The method as claimed in claim 18, wherein the raw magnetic resonance data are obtained using a magnetic resonance tomography unit.

21. The method as claimed in claim 1, wherein the raw magnetic resonance data are obtained using a magnetic resonance spectroscopy unit.

22. The method as claimed in claim 1, wherein the raw magnetic resonance data are obtained using a magnetic resonance tomography unit.

23. The method as claimed in claim 1, wherein the filtering is done using a low pass filter.

24. The method as claimed in claim 6, wherein the low pass filter is a type of Hanning filter.

25. The method as claimed m claim 1, wherein the filtering is done using a high pass filter.

26. The method as claimed in claim 25, wherein the high pass filter is a type of inverse Hanning filter.

27. The method as claimed in claim 1, wherein the raw magnetic resonance data are data for at least one of a one-dimensional and multidimensional space to be examined.

28. The method as claimed in claim 1, wherein the Fourier transformation maintains the dimensionality of the raw magnetic resonance data.

29. The method as claimed in claim 1, wherein the weighted combination involves addition of the absolute values of the magnetic resonance signals.

30. The method as claimed in claim 1, wherein, for the weighted combination, the contribution of one of the magnetic resonance signals has a nonlinear dependency on the absolute value of the other magnetic resonance signal.

31. The method as claimed in claim 1, wherein the weighted combination of the two magnetic resonance signals is weighted by two parameters $\lambda$ and $\kappa$ results in the post-processed magnetic resonance signal in the following manner:

$$C = A + \lambda \left(\frac{B}{A_{max}}\right)^{\kappa} B,$$

where
A is one of the magnetic resonance signals,
B is the other of the magnetic resonance signals,
$A_{max}$ is the maximum of the magnetic resonance signal A, and
C is the post-processed magnetic resonance signal.

32. The method as claimed in claim 31, wherein the parameter $\lambda$ is in the range between 0 and 3.

33. The method as claimed in claim 32, wherein the parameter $\kappa$ is in the range between 0 and 3.

34. The method as claimed in claim 31, wherein the parameter $\kappa$ is in the range between 0 and 3.

35. The method as claimed in claim 1, wherein more than two magnetic resonance signals are obtained from the raw magnetic resonance data by filtering.

36. A magnetic resonance tomography unit matched to a method for post-processing raw magnetic resonance data as claimed in claim 35.

37. A magnetic resonance spectroscopy unit matched to a method for post-processing raw magnetic resonance data as claimed in claim 35.

38. A magnetic resonance tomography unit matched to a method for post-processing raw magnetic resonance data as claimed in claim 1.

39. A magnetic resonance spectroscopy unit matched to a method for post-processing raw magnetic resonance data as claimed in claim 1.

40. The method as claimed in claim 1, wherein, for the weighted combination, the contribution of one of the magnetic resonance signals has a nonlinear dependency on the absolute value of the other magnetic resonance signal.

41. A magnetic resonance tomography unit matched to a method for post-processing raw magnetic resonance data as claimed in claim 40.

42. A magnetic resonance spectroscopy unit matched to a method for post-processing raw magnetic resonance data as claimed in claim 40.

43. A method for post-processing raw magnetic resonance data, the method comprising:
 filtering the raw magnetic resonance data;
 Fourier transforming the filtered data;
 forming a first magnetic resonance signal from the Fourier transformed filtered data results;
 Fourier transforming the raw magnetic resonance data;
 forming a second magnetic resonance signal from the Fourier transformed raw magnetic resonance data; and forming a post-processed magnetic resonance signal from a combination of the first and second magnetic resonance; wherein
the two magnetic resonance signals is weighted such that the contribution of one of the magnetic resonance signals to the weighted combination is formed by multiplying this magnetic resonance signal by a weighting factor, with the weighting factor depending on the other of the magnetic resonance signals such that it is relatively greater when an absolute value of this magnetic resonance signal is large and relatively less when the absolute value is small.

* * * * *